(12) United States Patent
Malik et al.

(10) Patent No.: US 6,881,644 B2
(45) Date of Patent: Apr. 19, 2005

(54) SMOOTHING METHOD FOR CLEAVED FILMS MADE USING A RELEASE LAYER

(75) Inventors: Igor J. Malik, Palo Alto, CA (US); Sien G. Kang, Pleasanton, CA (US)

(73) Assignee: Silicon Genesis Corporation, San Jose, CA (US)

( * ) Notice: Subject to any disclaimer, the term of this patent is extended or adjusted under 35 U.S.C. 154(b) by 273 days.

(21) Appl. No.: 10/150,483

(22) Filed: May 17, 2002

(65) Prior Publication Data

US 2003/0008477 A1 Jan. 9, 2003

Related U.S. Application Data

(63) Continuation of application No. 09/364,209, filed on Jul. 30, 1999, now abandoned.
(60) Provisional application No. 60/130,342, filed on Apr. 21, 1999.

(51) Int. Cl.$^7$ .............................................. H01L 21/00
(52) U.S. Cl. ........................ 438/409; 438/458; 438/705; 438/715; 438/960; 438/977; 216/33; 216/36; 216/56; 216/57; 216/58; 216/79
(58) Field of Search .............................. 216/33, 36, 56, 216/57, 58, 79; 438/409, 458, 705, 715, 960, 977

(56) References Cited

U.S. PATENT DOCUMENTS

| | | | |
|---|---|---|---|
| 3,964,957 A | 6/1976 | Walsh | |
| 4,495,219 A | 1/1985 | Kato et al. | |
| 4,530,149 A | 7/1985 | Jastrzebski et al. | |
| 4,906,594 A | 3/1990 | Yoneda et al. | |
| 5,141,878 A | 8/1992 | Benton et al. | |
| 5,198,071 A | 3/1993 | Scudder et al. | |
| 5,198,371 A | 3/1993 | Li | |
| 5,213,986 A | 5/1993 | Pinker et al. | |
| 5,374,564 A | 12/1994 | Bruel | |
| 5,409,563 A | 4/1995 | Cathey | |
| 5,427,052 A | 6/1995 | Ohta et al. | |
| 5,494,835 A | 2/1996 | Bruel | |
| 5,506,176 A | 4/1996 | Takizawa | |
| 5,508,207 A | 4/1996 | Horai et al. | |
| 5,518,965 A | 5/1996 | Menigaux et al. | |
| 5,559,043 A | 9/1996 | Bruel | |
| 5,686,980 A | 11/1997 | Hirayama et al. | |

(Continued)

FOREIGN PATENT DOCUMENTS

| | | |
|---|---|---|
| EP | 553 852 | 8/1993 |
| EP | 905 767 | 3/1999 |
| EP | 961 312 | 12/1999 |
| JP | 2000 94317 | 4/2000 |

OTHER PUBLICATIONS

Websters Dictionary, Tenth edition, p. 388 (1998).
Centura Epi "Epitaxial Deposition Chamber Specifications" Brochure, Applied Materials, Mar. 1994.
EPI Centura System Specifications Brochure, Applied Materials, Oct. 1996.

(Continued)

*Primary Examiner*—Allan Olsen
(74) *Attorney, Agent, or Firm*—Townsend and Townsend and Crew LLP

(57) ABSTRACT

A method for treating a film of material, which can be defined on a substrate, e.g., silicon. The method includes providing a substrate comprising a cleaved surface, which had a porous silicon layer thereon. The substrate may have a distribution of hydrogen bearing particles defined from the cleaved surface to a region underlying said cleaved surface. The method also includes increasing a temperature of the cleaved surface to greater than about 1,000 Degrees Celsius while maintaining the cleaved surface in a etchant bearing environment to reduce a surface roughness value by about fifty percent and greater. Preferably, the value can be reduced by about eighty or ninety percent and greater, depending upon the embodiment.

34 Claims, 8 Drawing Sheets

U.S. PATENT DOCUMENTS

| | | | |
|---|---|---|---|
| 5,705,421 | A | 1/1998 | Matsushita et al. |
| 5,714,395 | A | 2/1998 | Bruel |
| 5,841,931 | A | 11/1998 | Foresi |
| 5,854,123 | A | 12/1998 | Sato et al. |
| 5,869,387 | A | 2/1999 | Sato et al. |
| 5,869,405 | A | 2/1999 | Gonzalez et al. |
| 5,877,070 | A | 3/1999 | Goesele et al. |
| 5,966,620 | A | 10/1999 | Sakaguchi et al. |
| 5,966,625 | A | 10/1999 | Zhong et al. |
| 5,968,279 | A | 10/1999 | MacLeish et al. |
| 6,004,868 | A | 12/1999 | Rolfson et al. |
| 6,008,128 | A | 12/1999 | Habuka et al. |
| 6,107,213 | A | 8/2000 | Tayanaka |
| 6,143,628 | A | 11/2000 | Sato et al. |
| 6,162,705 | A | 12/2000 | Henley et al. |
| 6,171,965 | B1 | 1/2001 | Kang et al. |
| 6,171,982 | B1 | 1/2001 | Sato |
| 6,194,327 | B1 | 2/2001 | Gonzalez et al. |
| 6,204,151 | B1 | 3/2001 | Malik et al. |
| 6,214,701 | B1 | 4/2001 | Matsushita et al. |
| 6,251,754 | B1 | 6/2001 | Ohshima et al. |
| 6,274,464 | B1 | 8/2001 | Drobny et al. |
| 6,287,941 | B1 | 9/2001 | Kang et al. |
| 6,342,436 | B1 | 1/2002 | Takizawa |

OTHER PUBLICATIONS

Mahajan et al., *Principles of Growth and Processing of Semiconductors*, WCB McGraw–Hill, chapter 6, pp. 262–269.

Moriceau et al., "Hydrogen Annealing Treatment Used To Obtain Quality SOI Surfaces," *Proceedings of 1998 IEEE International SOI Conference*, pp. 37–38, from conference Oct. 5–8, 1998.

Sato et al., "Suppression of Si Etching during Hydrogen Annealing of Silicon–on–Insulator," *Proceedings 1998 IEEE SOI Conference*, pp. 17–18, from conference of Oct. 5–8, 1998.

Smith, D.L., *Thin–Film Deposition*, McGraw–Hill, Inc., pp. 185–196, 278–293.

Tate et al., "defect Reduction of Bonded SOI Wafers by Post Anneal Process in H2 Ambient," *Proceedings 1998 IEEE SOI Conference*, pp. 141–142, from conference of Oct. 5–8, 1998.

Tong et al., *Semiconductor Wafer Bonding: Science and Technology*, John Wiley & Sons, Inc., pp. 152–171.

SMOOTHING METHOD FOR CLEAVED FILMS MADE USING A RELEASE LAYER

This application is a continuation of Ser. No. 09/364,209 filed Jul. 30, 1999, now abandoned, which claim benefit of Provisional 60/130,342 filed Apr. 21, 1999.

BACKGROUND OF THE INVENTION

The present invention relates to the manufacture of objects. More particularly, the present invention provides a technique for improving surface texture or surface characteristics of a film of material, e.g., silicon, silicon germanium, or others. The present invention can be applied to treating or smoothing a cleaved film from a layer transfer process for the manufacture of integrated circuits, for example. But it will be recognized that the invention has a wider range of applicability; it can also be applied to smoothing a film for other substrates such as multi-layered integrated circuit devices, three-dimensional packaging of integrated semiconductor devices, photonic devices, piezoelectronic devices, microelectromechanical systems ("MEMS"), sensors, actuators, solar cells, flat panel displays (e.g., LCD, AMLCD), doping semiconductor devices, biological and biomedical devices, and the like.

Integrated circuits are fabricated on chips of semiconductor material. These integrated circuits often contain thousands, or even millions, of transistors and other devices. In particular, it is desirable to put as many transistors as possible within a given area of semiconductor because more transistors typically provide greater functionality, and a smaller chip means more chips per wafer and lower costs. Some integrated circuits are fabricated on a slice or wafer, of single-crystal (monocrystalline) silicon, commonly termed a "bulk" silicon wafer. Devices on such "bulk" silicon wafer typically are isolated from each other. A variety of techniques have been proposed or used to isolate these devices from each other on the bulk silicon wafer, such as a local oxidation of silicon ("LOCOS") process, trench isolation, and others. These techniques, however, are not free from limitations. For example, conventional isolation techniques consume a considerable amount of valuable wafer surface area on the chip, and often generate a non-planar surface as an artifact of the isolation process. Either or both of these considerations generally limit the degree of integration achievable in a given chip. Additionally, trench isolation often requires a process of reactive ion etching, which is extremely time consuming and can be difficult to achieve accurately.

An approach to achieving very-large scale integration ("VLSI") or ultra-large scale integration ("ULSI") is by using a semiconductor-on-insulator ("SOI") wafer. An SOI wafer typically has a layer of silicon on top of a layer of an insulator material. A variety of techniques have been proposed or used for fabricating the SOI wafer. These techniques include, among others, growing a thin layer of silicon on a sapphire substrate, bonding a layer of silicon to an insulating substrate, and forming an insulating layer beneath a silicon layer in a bulk silicon wafer. In an SOI integrated circuit, essentially complete device isolation is often achieved using conventional device processing methods by surrounding each device, including the bottom of the device, with an insulator. An advantage SOI wafers have over bulk silicon wafers is that the area required for isolation between devices on an SOI wafer is less than the area typically required for isolation on a bulk silicon wafer.

SOI offers other advantages over bulk silicon technologies as well. For example, SOI offers a simpler fabrication sequence compared to a bulk silicon wafer. Devices fabricated on an SOI wafer may also have better radiation resistance, less photo-induced current, and less cross-talk than devices fabricated on bulk silicon wafers. Many problems, however, that have already been solved regarding fabricating devices on bulk silicon wafers remain to be solved for fabricating devices on SOI wafers.

For example, SOI wafers generally must also be polished to remove any surface irregularities from the film of silicon overlying the insulating layer. Polishing generally includes, among others, chemical mechanical polishing, commonly termed CMP. CMP is generally time consuming and expensive, and can be difficult to perform cost efficiently to remove surface non-uniformities. That is, a CMP machine is expensive and requires large quantities of slurry mixture, which is also expensive. The slurry mixture can also be highly acidic or caustic. Accordingly, the slurry mixture can influence functionality and reliability of devices that are fabricated on the SOI wafer.

From the above, it is seen that an improved technique for manufacturing a substrate such as an SOI wafer is highly desirable.

SUMMARY OF THE INVENTION

According to the present invention, a technique for treating a film of material is provided. More particularly, the present invention provides a method for treating a cleaved surface and/or an implanted surface using a combination of thermal treatment and chemical reaction, which can form a substantially smooth film layer from the cleaved surface.

In a specific embodiment, the present invention provides a method for forming a semiconductor substrate. The method includes forming a first porous silicon layer on at least one surface of a silicon substrate; and forming a second layer having a larger porosity than the first porous silicon layer at a constant depth from a surface of the porous silicon in the first porous silicon layer. The second layer forming step comprising implanting ions into the first porous silicon layer with a given projection range. The method also includes bonding the non-porous layer and a support substrate together. Next, the method includes a step of separating the silicon substrate into two portions at the second layer to remove the porous silicon layer exposed on a surface of the support substrate and exposing the non-porous layer. The method includes smoothing the nonporous layer by subjecting surface(s) of the non-porous layer using an etchant species (e.g., HCl) and thermal treatment. The present substrate can be maintained at 1 atmosphere in some embodiments.

Numerous benefits are achieved by way of the present invention over pre-existing techniques. For example, the present invention provides an efficient technique for forming a substantially uniform surface on an SOI wafer. Additionally, the substantially uniform surface is made by way of common hydrogen treatment and etching techniques, which can be found in conventional epitaxial tools. Furthermore, the present invention provides a novel uniform layer, which can be ready for the manufacture of integrated circuits. The present invention also relies upon standard fabrication gases such as HCl and hydrogen gas. In preferred embodiments, the present invention can improve bond interface integrity, improve crystal structure, and reduce defects in the substrate simultaneously during the process. Depending upon the embodiment, one or more of these benefits is present. These and other advantages or benefits are described throughout the present specification and are described more particularly below.

These and other embodiments of the present invention, as well as its advantages and features are described in more detail in conjunction with the text below and attached Figs.

DESCRIPTION OF THE SPECIFIC EMBODIMENT

According to the present invention, a technique for treating a film of material is provided. More particularly, the present invention provides a method for treating a cleaved surface and/or an implanted surface using a combination of thermal treatment and chemical reaction, which can form a substantially smooth film layer from the cleaved surface. The invention will be better understood by reference to the Figs. and the descriptions below.

Figure 1A:
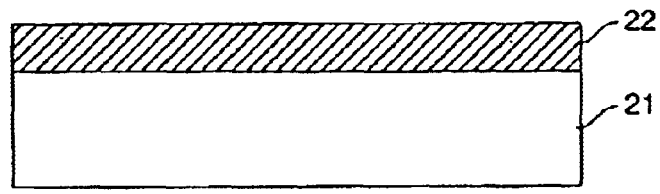
FIGS. 1A to 1D are schematic diagrams for explaining a semiconductor substrate producing process according to an embodiment of the present invention.
Figure 1B:
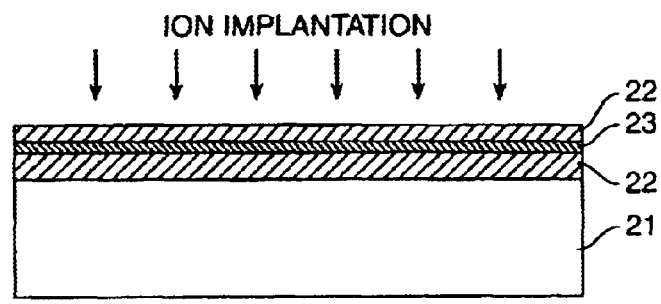

As shown in FIG. 1A, a silicon single-crystal substrate 21 is first prepared and then rendered porous at its surface layer. Numeral 22 denotes the resulting porous layer. As shown in FIG. 1B, at least one kind of noble gas, hydrogen and nitrogen is ion-implanted into the porous layer 22. Then, a porous layer (ion-implanted layer) 23 having large porosity is formed in the porous layer 22. The charge condition of the implanted ions is not particularly limited. The acceleration energy is set such that the projection range corresponds to a depth at which the ion implantation is desired. Depending on the implantation amount, the size and the density of the micro-cavities to be formed are changed, but approximately no less than $1 \times 10^{14}/cm^2$ and more preferably $1 \times 10^{15}/cm^2$. When setting the projection range to be deeper, the channeling ion implantation may be employed. After the implantation, the heat treatment is performed or at least one of compressive, tensile and shear stresses is applied to the wafer in a direction perpendicular to the surface as necessary, so as to divide the semiconductor substrate into two at the ion-implanted layer as a border. In the case of the heat treatment atmosphere being an oxidizing atmosphere, the pore walls are oxidized so that attention should be given to preventing the silicon region from being all changed into silicon oxide due to over oxidation.

Figure 1C:
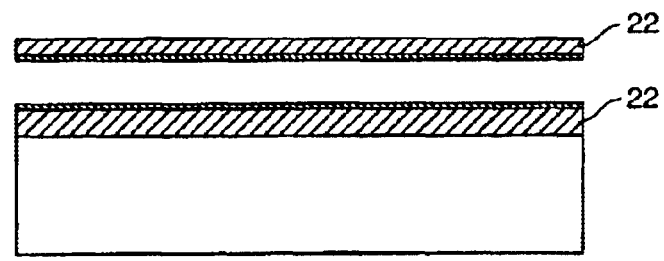

In FIG. 1C, the extremely thin porous substrate obtained by the present invention is shown. Since the division of the substrate starts spontaneously upon the heat treatment or the like as a trigger due to the internal stress introduced upon the implantation, the extremely thin porous structure can be formed uniformly all over the substrate. The pores of the porous structure are formed from one main surface of the substrate toward the other main surface. Accordingly, when the gas is implanted under pressure from the one main surface, it is ejected out from the other main surface. In this case, since the pore size of the porous structure is in the range from several nanometers to several tens of nanometers, a particle greater than this can not pass therethrough. On the other hand, although pressure loss is caused depending on the pore size, the pore density and a thickness of the extremely thin porous substrate, the strength of the substrate and the pressure loss can be both within the practical range if the thickness of the porous layer is approximately no more than 20 microns.

Figure 1D:
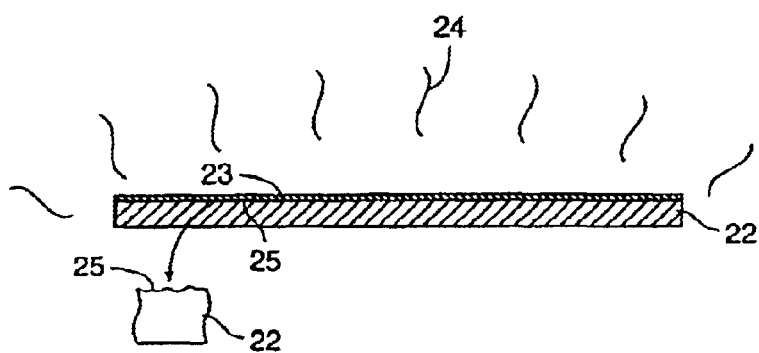

As shown in FIG. 1D, porous layer 22, which has an overlying layer 23, is subjected to further processing. Here, layer 23 is removed by etching techniques. Once layer 23 is removed, a surface treatment process 24 is provided. The surface treatment process removes surface roughness from the surface 25 of the porous layer. The film of silicon material is often rough 25 and needs finishing. The rough surface for silicon wafers is often about two to eight nanometers RMS or greater. This roughness often should be removed before further processing. In a specific embodiment, the detached surface has a concentration of hydrogen bearing particles therein and thereon from the previous implanting step.

To smooth or treat the surface, the substrate is subjected to thermal treatment in a hydrogen bearing environment. Additionally, the substrate is also subjected to an etchant including a halogen bearing compound such as HCl, HBr, HI, HF, and others. The etchant can also be a fluorine bearing compound such as SF6, CxFx. In preferred embodiments, the present substrate undergoes treatment using a combination of heating a substrate. In an embodiment using a silicon wafer and hydrogen gas, the tool can heat the substrate at a rate of about 10 Degrees Celsius/second and greater or 20 Degrees Celsius/second and greater, depending upon the embodiment.

In one embodiment, it is believed that the hydrogen particles in the detached surface improve the surface smoothing process. Here, the hydrogen particles have been maintained at a temperature where they have not diffused out of the substrate In a specific embodiment, the concentration of hydrogen particles ranges from about 1021 to about $5 \times 1022$ atoms/cm3. Alternatively, the concentration of hydrogen particles is at least about $6 \times 1021$ atoms/cm3. Depending upon the embodiment, the particular concentration of the hydrogen particles can be adjusted.

Still further in other embodiments, the present substrate undergoes a process of hydrogen treatment or implantation before thermal treatment purposes. Here, the substrate, including the detached film, is subjected to hydrogen bearing particles by way of implantation, diffusion, or any combination thereof. In some embodiments, where hydrogen has diffused out from the initial implant, a subsequent hydrogen treatment process can occur to increase a concentration of hydrogen in the detached film. The present hydrogen treatment process can occur for substrates made by way of other processes such as those noted below.

Moreover, the present technique for finishing the cleaved surface can use a combination of etchant, deposition, and thermal treatment to smooth the cleaved film. Here, the cleaved film is subjected to hydrogen bearing compounds such as HCl, HBr, HI, HF, and others. Additionally, the cleaved film is subjected to for example, deposition, during a time that the film is subjected to the hydrogen bearing compounds, which etch portions of the cleaved film. Using a silicon cleaved film for example, the deposition may occur by way of a silicon bearing compound such as silanes, e.g., $Si_xCl_yH_z$, $SiH_4$, $SiCl_x$, and other silicon compounds. Accordingly, the present method subjects the cleaved film to a combination of etching and deposition using a hydrogen bearing compound and a silicon bearing compound. Additionally, the cleaved surface undergoes thermal treatment while being subjected to the combination of etchant and deposition gases. The thermal treatment can be from a furnace, but is preferably from a rapid thermal processing tool such as an RTP tool. Alternatively, the tool can be an epitaxial chamber, which has lamps for rapidly heating a substrate. In an embodiment using a silicon wafer and hydrogen gas, the tool can heat the substrate at a rate of about 10 Degrees Celsius/second and greater or 20 Degrees Celsius/second and greater, depending upon the embodiment.

Figure 2A:
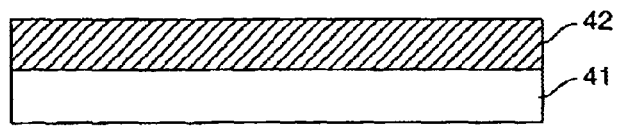
FIGS. 2A to 2G are schematic diagrams for explaining a semiconductor substrate producing process according to an embodiment of the present invention.
Figure 2B:
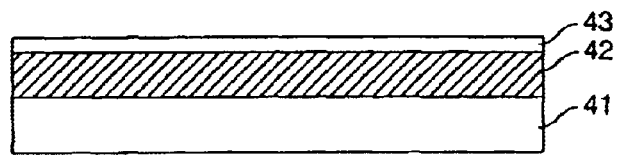

As shown in FIG. 2A, a silicon single-crystal substrate 41 is first prepared and then rendered porous at its surface layer. Numeral 42 denotes the resulting porous layer. Subsequently, as shown in FIG. 2B, at least one non-porous thin film 43 is formed on the porous layer. The film to be formed is arbitrarily selected from among a single-crystal silicon film, a polycrystalline silicon film, an amorphous silicon film, a metal film, a compound semiconductor film, a superconductive film and the like. Or an element structure such as a MOSFET may be formed.

Figure 2C:
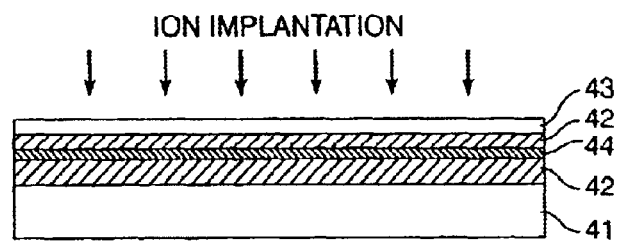

As shown in FIG. 2C, at least one kind of noble gas, hydrogen and nitrogen is ion-implanted into the porous layer 42 so as to form an implanted layer 44. When observing the implanted layer by a transmission electron microscope, formation of numberless micro-cavities can be seen. The charge condition of the implanted ions is not particularly limited. The acceleration energy is set such that the projection range corresponds to a depth at which the ion implantation is desired. Depending on the implantation amount, the size and the density of the micro-cavities to be formed are changed, but approximately no less than $1 \times 10^{14}/cm^2$ and more preferably $1 \times 10^{15}/cm^2$. When setting the projection range to be deeper, the channeling ion implantation may be employed. After the implantation, the heat treatment is performed as necessary. In case of the heat treatment atmosphere being the oxidizing atmosphere, the pore walls are oxidized so that attention should be given to preventing the silicon region from being all changed into silicon oxide due to over oxidation.

Figure 2D:
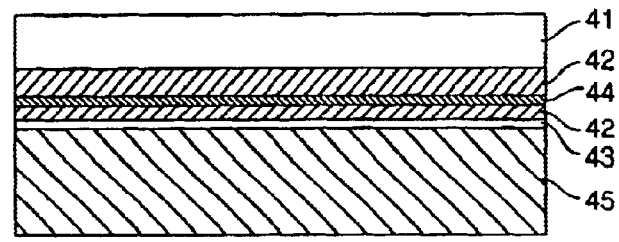

As shown in FIG. 2D, after abutting a support substrate 45 and the surface of the first substrate with each other at room temperature, they are bonded to each other through anodic bonding, pressurization, heat treatment or a combination thereof. As a result, both substrates are firmly coupled with each other.

When single-crystal silicon is deposited, it is preferable to perform the bonding after oxidized silicon is formed on the surface of single-crystal silicon through thermal oxidation or the like. On the other hand, the support substrate can be selected from among a silicon substrate, a silicon substrate with a silicon oxide film formed thereon, a light transmittable substrate such as quartz, a sapphire substrate and the like, but not limited thereto as long as the surface serving for the bonding is fully flat. The bonding may be performed in three plies with an insulating thin plate interposed therebetween.

Figure 2E:
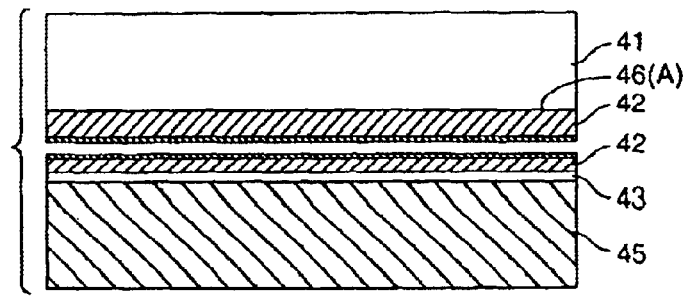

Subsequently, the substrates are divided at the ion-implanted layer 44 in the porous silicon layer 42 (FIG. 2E).

The structure of the second substrate side includes the porous silicon layer 42, the non-porous thin film (for example, the single-crystal silicon layer) 43 and the second substrate 45.

Further, the porous silicon layer 42 is selectively removed. In case of the non-porous thin film being single-crystal silicon, only the porous silicon layer 42 is subjected to the electroless wet chemical etching using at least one of the normal silicon etching liquid, hydrofluoric acid being the porous silicon selective etching liquid, a mixed liquid obtained by adding at least one of alcohol and aqueous hydrogen peroxide water to hydrofluoric acid, buffered hydrofluoric acid, and a mixed liquid obtained by adding at least one of alcohol and aqueous hydrogen peroxide to buffered hydrofluoric acid, so as to render the film formed in advance on the porous layer of the first substrate remain on the second substrate. As described above in detail, only the porous silicon layer can be selectively etched using the normal silicon etching liquid due to the extensive surface area of porous silicon. Alternatively, the porous silicon layer 42 may be removed through selective polishing using the single-crystal silicon layer 43 as a polishing stopper.

In the case where the compound semiconductor layer is formed on the porous layer, only the porous silicon layer 42 is subjected to chemical etching using the etching liquid which has the greater etching speed for silicon relative to the compound semiconductor, so that the thickness-reduced single-crystal compound semiconductor layer 43 remains on the insulating substrate 45. Alternatively, the porous silicon layer 42 is removed through selective polishing using the single-crystal compound semiconductor layer 43 as a polishing stopper.

Figure 2F:
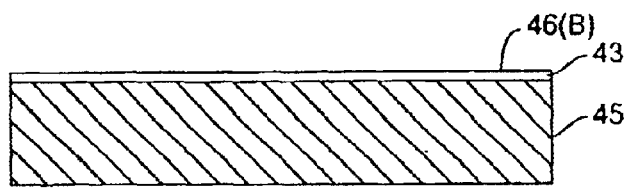

In FIG. 2F, the semiconductor substrate of the present invention is shown. On the insulating substrate 45, the non-porous thin film, such as the single-crystal silicon thin film 43, is formed in a large area all over the wafer, flatly and uniformly reduced in thickness. The semiconductor substrate thus obtained can be suitably used in production of an insulated electronic element.

Figure 2G:
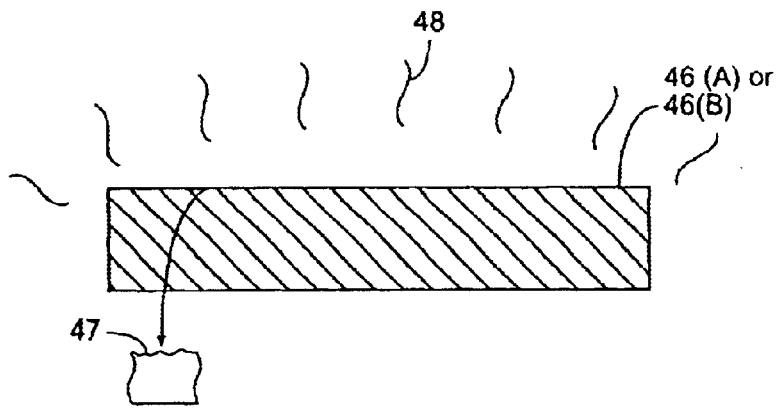

The silicon single-crystal substrate 41 can be reused as an silicon single-crystal substrate 41 after removing remaining any porous silicon and after performing surface-flattening if the surface flatness makes the substrate unusable. Alternatively, a non-porous thin film may be again formed without removing porous silicon so as to provide the substrate as shown in FIG. 2B, which is then subjected to the processes shown in FIGS. 2C to 2F. In embodiments where flattening is desirable, a novel surface processing step is provided, as shown in FIG. 2G. Alternatively, smoothing or flattening of the single crystal silicon thin film is also provided, as shown in FIG. 2G.

FIG. 2G illustrates a surface 47 smoothing step for either surface 46(a) or 46(b) according to an embodiment of the present invention. As shown, surface 47 is often rough and needs finishing. The present surface treatment process removes surface roughness from surface 47. The rough surface for silicon wafers is often about two to eight nanometers RMS or greater. This roughness often should be removed before further processing. In a specific embodiment, the detached surface has a concentration of hydrogen bearing particles therein and thereon from the previous implanting step.

To smooth or treat the surface, the substrate is subjected to thermal treatment in a hydrogen bearing environment. Additionally, the substrate is also subjected to an etchant including a halogen bearing compound such as HCl, HBr, HI, HF, and others. The etchant can also be a fluorine bearing compound such as $SF_6$, $C_xF_x$. In preferred embodiments, the present substrate undergoes treatment using a combination of etchant and thermal treatment in a hydrogen bearing environment. In a specific embodiment, the etchant is HCl gas or the like. The thermal treatment uses a hydrogen etchant gas. In some embodiments, the etchant gas is a halogenated gas, e.g., HCl, HF, HI, HBr, $SF_6$, $CF_4$, $NF_3$, and $CCl_2F_2$. The etchant gas can also be mixed with another halogen gas, e.g., chlorine, fluorine. The thermal treatment can be from a furnace, but is preferably from a rapid thermal processing tool such as an RTP tool. Alternatively, the tool can be from an epitaxial chamber, which has lamps for rapidly heating a substrate. In an embodiment using a silicon wafer and hydrogen gas, the tool can heat the substrate at a rate of about 10 Degrees Celsius/second and greater or 20 Degrees Celsius/second and greater, depending upon the embodiment.

In one embodiment, it is believed that the hydrogen particles in the detached surface improves the surface smoothing process. Here, the hydrogen particles have been maintained at a temperature where they have not diffused out of the substrate. In a specific embodiment, the concentration of hydrogen particles ranges from about $10^{21}$ to about $5\times10^{22}$ atoms/cm$^3$. Alternatively, the concentration of hydrogen particles is at least about $6\times10^{21}$ atoms/cm$^3$. Depending upon the embodiment, the particular concentration of the hydrogen particles can be adjusted.

Still further in other embodiments, the present substrate undergoes a process of hydrogen treatment or implantation before thermal treatment purposes. Here, the substrate, including the detached film, is subjected to hydrogen bearing particles by way of implantation, diffusion, or any combination thereof. In some embodiments, where hydrogen has diffused out from the initial implant, a subsequent hydrogen treatment process can occur to increase a concentration of hydrogen in the detached film. The present hydrogen treatment process can occur for substrates made by way of other processes such as those noted below.

Moreover, the present technique for finishing the cleaved surface can use a combination of etchant, deposition, and thermal treatment to smooth the cleaved film. Here, the cleaved film is subjected to hydrogen bearing compounds such as HCl, HBr, HI, HF, and others. Additionally, the cleaved film is subjected to for example, deposition, during a time that the film is subjected to the hydrogen bearing compounds, which etch portions of the cleaved film. Using a silicon cleaved film for example, the deposition may occur by way of a silicon bearing compound such as silanes, e.g., $Si_xCl_yH_z$, $SiH_4$, $SiCl_x$, and other silicon compounds. Accordingly, the present method subjects the cleaved film to a combination of etching and deposition using a hydrogen bearing compound and a silicon bearing compound. Additionally, the cleaved surface undergoes thermal treatment while being subjected to the combination of etchant and deposition gases The thermal treatment can be from a furnace, but is preferably from a rapid thermal processing tool such as an RTP tool. Alternatively, the tool can be an epitaxial chamber, which has lamps for rapidly heating a substrate. In an embodiment using a silicon wafer and hydrogen gas, the tool can heat the substrate at a rate of about 10 Degrees Celsius/second and greater or 20 Degrees Celsius/second and greater, depending upon the embodiment.

Figure 3A:
FIGS. 3A to 3F are schematic diagrams for explaining a semiconductor substrate producing process according to an embodiment of the present invention.
Figure 3B:
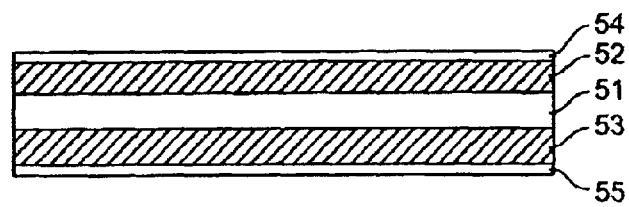

As shown in FIG. 3A, a silicon single-crystal substrate 51 is first prepared and then rendered porous at both surface layers thereof. Numerals 52 and 53 denote the obtained porous layers. Subsequently, as shown in FIG. 3B, at least one non-porous thin film 54, 55 is formed on each of the porous layers. The film to be formed is arbitrarily selected from among a single-crystal silicon film, a polycrystalline silicon film, an amorphous silicon film, a metal film, a compound semiconductor film, a superconductive film and the like. Or an element structure such as a MOSFET may be formed.

Figure 3C:
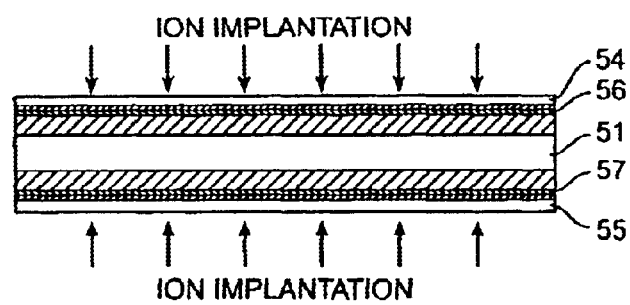

As shown in FIG. 3C, at least one kind of noble gas, hydrogen and nitrogen is ion-implanted into the porous layers 52 and 53 so as to form implanted layers 56 and 57. When observing the implanted layers by a transmission electron microscope, formation of numberless micro-cavities can be seen, and accordingly the porosity enlarges. The charge condition of the implanted ions is not particularly limited. The acceleration energy is set such that the projection range corresponds to a depth at which the ion implantation is desired. Depending on the implantation amount, the size and the density of the micro-cavities to be formed are changed, but they are approximately no less than $1\times10^{14}$/cm$^2$ and more preferably $1\times10^{15}$/cm$^2$. When setting the projection range deeper, channeling ion implantation may be employed. After the implantation, heat treatment is performed as necessary. In the case of the heat treatment atmosphere being oxidizing atmosphere, the pore walls are oxidized so that attention should be given to preventing the silicon region from being all changed into silicon oxide due to over oxidation.

Figure 3D:
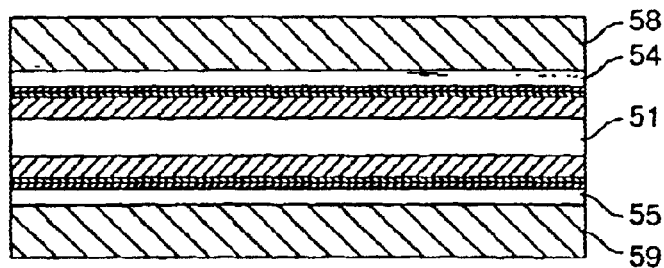

As shown in FIG. 3D, after abutting two support substrates 58 and 59 and the surfaces of the non-porous thin films 54 and 55 of the first substrate with each other at room temperature, they are bonded to each other through anode bonding, pressurization, heat treatment or a combination thereof. As a result, the three substrates are firmly coupled with each other. Alternatively, the bonding may be performed in five plies with insulating thin plates interposed therebetween.

When single-crystal silicon is deposited, it is preferable to perform the bonding after oxidized silicon is formed on the surface of single-crystal silicon through thermal oxidation or the like. On the other hand, the support substrate can be selected from among a silicon substrate, a silicon substrate with a silicon oxide film formed thereon, a light transmittable substrate such as quartz, a sapphire substrate and the like, but not limited thereto as long as the surface serving for the bonding is completely flat. The bonding may be performed in three plies with an insulating thin plate interposed therebetween.

Figure 3E:
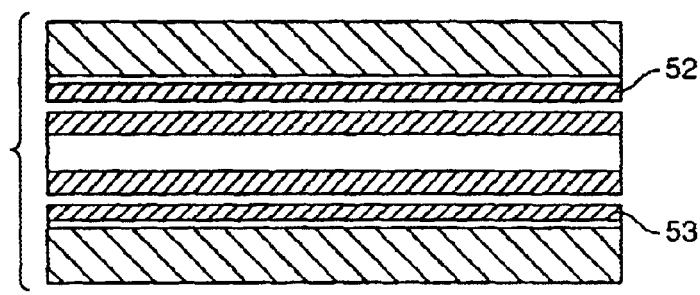

Subsequently, the substrates are divided at the ion-implanted layers 56 and 57 in the porous silicon layers 52 and 53 (FIG. 3E). The structure of each of the two support substrate sides includes the porous silicon layer 52, 53, the non-porous thin film (for example, the single-crystal silicon layer) 54, 55 and the support substrate 58, 59.

Further, the porous silicon layer 52, 53 is selectively removed. In case of the non-porous thin film being single-crystal silicon, only the porous silicon layer 52, 53 is subjected to the electroless wet chemical etching using at least one of the normal silicon etching liquid, hydrofluoric acid being the porous silicon selective etching liquid, a mixed liquid obtained by adding at least one of alcohol and aqueous hydrogen peroxide to hydrofluoric acid, buffered hydrofluoric acid, and a mixed liquid obtained by adding at least one of alcohol and aqueous hydrogen peroxide to buffered hydrofluoric acid, so that the film formed in advance on the porous layer of the first substrate remains on the support substrate. As described above in detail, only the porous silicon layer can be selectively etched using the normal silicon etching liquid due to the extensive surface area of porous silicon. Alternatively, the porous silicon layer 52, 53 may be removed through selective polishing using the single-crystal silicon layer 54, 55 as a polishing stopper.

In the case where the compound semiconductor layer is formed on the porous layer, only the porous silicon layer 52, 53 is subjected to chemical etching using the etching liquid which has the greater etching speed for silicon relative to the compound semiconductor, so that the thickness-reduced single-crystal compound semiconductor layer 54, 55 remains on the insulating substrate. Alternatively, the porous silicon layer 52, 53 is removed through selective polishing using the single-crystal compound semiconductor layer 54, 55 as a polishing stopper.

Figure 3F:
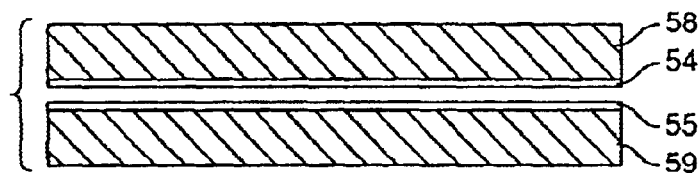

In FIG. 3F, the semiconductor substrates of the present invention are shown. On the support substrates, the non-porous thin films, such as the single-crystal silicon thin films 54 and 55, are formed in large area all over the wafer, flatly and uniformly reduced in thickness, so that the two semiconductor substrates are simultaneously formed. The semiconductor substrates thus obtained can be suitably used also in view of production of the insulated electronic elements.

The first silicon single-crystal substrate 51 can be reused as a first silicon single-crystal substrate 51 after removing remaining porous silicon and after performing surface-flattening if the surface flatness makes it unusable. Alternatively, a non-porous thin film may be again formed without removing porous silicon so as to provide the substrate as shown in FIG. 3B, which is then subjected to the processes shown in FIGS. 3C to 3F. The support substrates 58 and 59 are not necessarily identical with each other.

In a specific embodiment, any of the above surfaces can be treated for smoothing purposes. Here, the final silicon surface may often be rough and needs finishing. The present surface treatment process removes surface roughness from the surface of the porous layer or silicon material. The rough surface for silicon wafers is often about two to eight nanometers RMS or greater. This roughness often should be removed before further processing. In a specific embodiment, the detached surface has a concentration of hydrogen bearing particles therein and thereon from the previous implanting step.

To smooth or treat the surface, the substrate is subjected to thermal treatment in a hydrogen bearing environment. Additionally, the substrate is also subjected to an etchant including a halogen bearing compound such as HCl, HBr, HI, HF, and others. The etchant can also be a fluorine bearing compound such as SF6, CxFx. In preferred embodiments, the present substrate undergoes treatment using a combination of etchant and thermal treatment in a hydrogen bearing environment. In a specific embodiment, the etchant is HCl gas or the like. The thermal treatment uses a hydrogen etchant gas. In some embodiments, the etchant gas is a halogenated gas, e.g., HCl, HF, HI, HBr, SF6, CF4, NF3, and CCl2F2. The etchant gas can also be mixed with another halogen gas, e.g., chlorine, fluorine. The thermal treatment can be from a furnace, but is preferably from a rapid thermal processing tool such as an RTP tool. Alternatively, the tool can be an epitaxial chamber, which has lamps for rapidly heating a substrate. In an embodiment using a silicon wafer and hydrogen gas, the tool can heat the substrate at a rate of about 10 Degrees Celsius/second and greater or 20 Degrees Celsius/second and greater, depending upon the embodiment.

In one embodiment, it is believed that the hydrogen particles in the detached surface improve the surface smoothing process. Here, the hydrogen particles have been maintained at a temperature where they have not diffused out of the substrate. In a specific embodiment, the concentration of hydrogen particles ranges from about 1021 to about 5×1022 atoms/cm3. Alternatively, the concentration of hydrogen particles is at least about 6×1021 atoms/cm3. Depending upon the embodiment, the particular concentration of the hydrogen particles can be adjusted.

Still further in other embodiments, the present substrate undergoes a process of hydrogen treatment or implantation before thermal treatment purposes. Here, the substrate, including the detached film, is subjected to hydrogen bearing particles by way of implantation, diffusion, or any combination thereof. In some embodiments, where hydrogen has diffused out from the initial implant, a subsequent hydrogen treatment process can occur to increase a concentration of hydrogen in the detached film. The present hydrogen treatment process can occur for substrates made by way of other processes such as those noted below.

Moreover, the present technique for finishing the cleaved surface can use a combination of etchant, deposition, and thermal treatment to smooth the cleaved film. Here, the cleaved film is subjected to hydrogen bearing compounds such as HCl, HBr, HI, HF, and others. Additionally, the cleaved film is subjected to for example, deposition, during a time that the film is subjected to the hydrogen bearing compounds, which etch portions of the cleaved film. Using a silicon cleaved film for example, the deposition may occur by way of a silicon bearing compound such as silanes, e.g., SixClyHz, SiH4, SiClx, and other silicon compounds. Accordingly, the present method subjects the cleaved film to a combination of etching and deposition using a hydrogen bearing compound and a silicon bearing compound. Additionally, the cleaved surface undergoes thermal treatment while being subjected to the combination of etchant and deposition gases The thermal treatment can be from a furnace, but is preferably from a rapid thermal processing tool such as an RTP tool. Alternatively, the tool can be an epitaxial chamber, which has lamps for rapidly heating a substrate. In an embodiment using a silicon wafer and hydrogen gas, the tool can heat the substrate at a rate of about 10 Degrees Celsius/second and greater or 20 Degrees Celsius/second and greater, depending upon the embodiment.

Figure 4A:
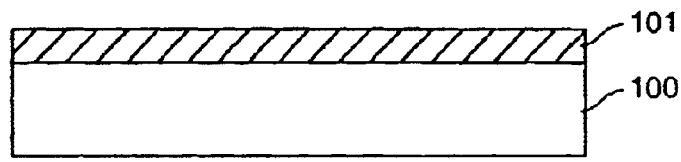
FIGS. 4A to 4E are schematic diagrams for explaining a semiconductor substrate producing process-according to an embodiment of the present invention.

An alternative embodiment will be described with reference to FIGS. 4A to 4E. First, a single-crystal silicon substrate 100 is anodized to form a porous silicon layer 101 (FIG. 4A). In this case, a thickness to be rendered porous is in the range from several micrometers to several tens of micrometers on one surface layer of the substrate. It may be arranged to anodize the whole silicon substrate 100.

Figure 7A:
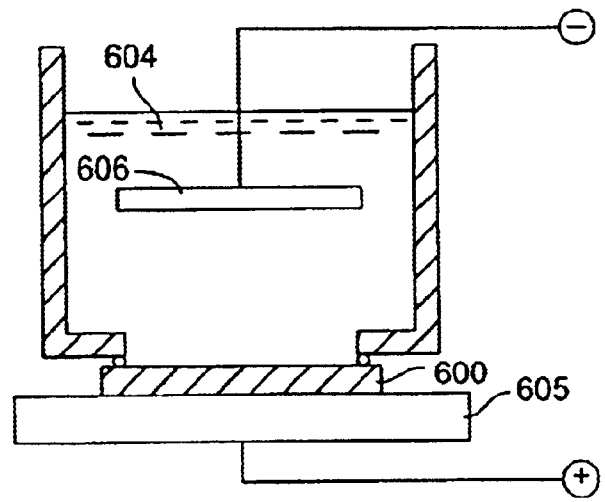
FIGS. 7A and 7B are simplified side-view diagrams of anodization systems according to an embodiment of the present invention
Figure 7B:
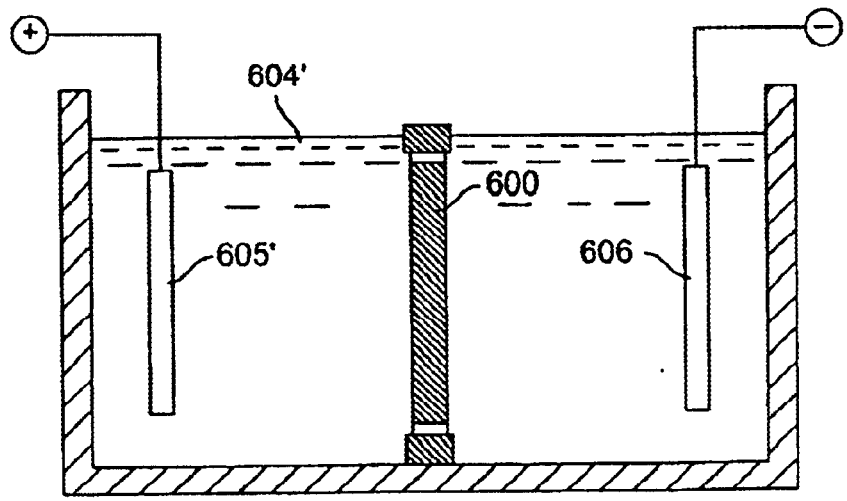

The method of forming porous silicon will be explained using FIGS. 7A and 7B. First, as the substrate, a p-type single-crystal silicon substrate 600 is prepared. An n-type may also be used. However, in this case, it is necessary that the substrate is limited to a low-resistance substrate or that the light is applied onto the surface of the substrate so as to facilitate generation of the holes. The substrate 600 is set in an apparatus as shown in FIG. 7A. Specifically, one side of the substrate is in contact with a hydrofluoric acid solution 604 having therein a negative electrode 606, while the other side of the substrate is in contact with a positive metal electrode 605. On the other hand, as shown in FIG. 7B, a positive electrode 605' may also be provided in a solution 604'. In any case, the substrate is first rendered porous from the negative electrode side abutting the hydrofluoric acid solution. As the hydrofluoric acid solution 604, concentrated hydrofluoric acid (49% HF) is used in general. As diluted by pure water ($H_2O$), although depending on current values, etching occurs from a certain concentration so that it is not preferable. During anodization, bubbles are generated from the surface of the substrate 600. Alcohol may be added as a surface active agent for effective removal of the bubbles. As alcohol, methanol, ethanol, propanol, isopropanol or the like is used. Instead of the surface active agent, an agitator may be used to agitate the solution to achieve anodization. The negative electrode 606 is made of a material, such as gold (Au) or platinum (Pt), which does not corrode relative to the hydrofluoric acid solution. A material of the positive electrode 605 may be metal which is used in general. On the other hand, since the hydrofluoric acid solution 604 reaches the positive electrode 605 when anodization is achieved relative to the whole substrate 600, it is preferable to coat the surface of the positive electrode 605 with a metal film which is resistive to the hydrofluoric acid solution. The maximum current value for anodization is several hundreds of $mA/cm^2$, while the minimum current value therefore is arbitrary, other than zero. This current value is determined in range where the good-quality epitaxial growth is achieved on the surface of porous silicon. In general, as the current value increases, the anodization speed increases and the density of the porous silicon layer decreases. That is, the volume of the pores increases. This changes the condition of the epitaxial growth.

Figure 4B:
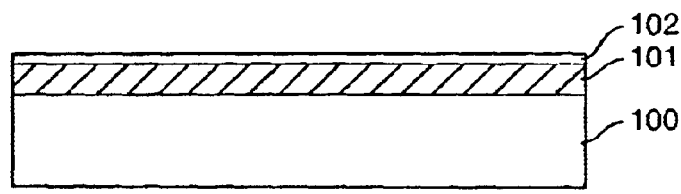
Figure 4C:
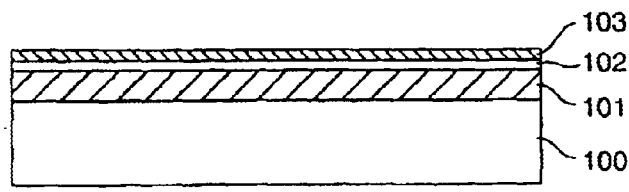

On the porous layer 101 thus formed, a non-porous single-crystal silicon layer 102 is epitaxially-grown (FIG. 4B). Subsequently, the surface of the epitaxial layer 102 is oxidized (including thermal oxidation) so as to form an SiO2 layer 103 (FIG. 4C). This is necessary because, if the epitaxial layer is directly bonded to the support substrate in the next process, impurities tend to segregate at the bonded interface and dangling bonds of atoms at the interface increase, which will cause the thin film device to be unusable. However, this process is not essential, but may be omitted in a device structure wherein such phenomena are not serious. The SiO2 layer 103 works as an insulating layer of the SOI substrate and should be formed on at least one side of the substrate to be bonded. There are various ways to form the insulating layer.

Upon oxidation, a thickness of the oxidized film is set to a value which is free of contamination taken into the bonded interface from the atmosphere.

Thereafter, the foregoing ion implantation is performed to form a layer with large porosity in the porous silicon layer 101. The substrate 100 having the foregoing epitaxial surface with the oxidized surface and a support substrate 110 having an $SiO_2$ layer 104 on the surface are prepared. The support substrate 110 may be a silicon substrate whose surface is oxidized (including thermal oxidation), quartz glass, crystallized glass, an arbitrary substrate with $SiO_2$ deposited thereon, or the like. A silicon substrate without the $SiO_2$ layer 104 may also be used as the support substrate.

Figure 4D:
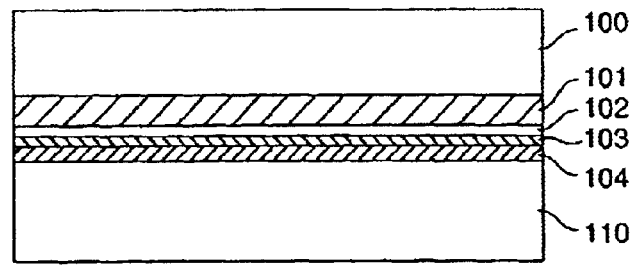

The foregoing two substrates are bonded together after cleaning them (FIG. 4D). The cleaning is performed pursuant to the process of cleaning (for example, before oxidation) the normal semiconductor substrate. By pressurizing the whole substrate after the bonding, the bonding strength can be enhanced.

Subsequently, the bonded substrates are subjected to heat treatment. Although a high temperature is preferable for the heat treatment, if it is too high, the porous layer 101 tends to cause structural change or the impurities contained in the substrate tend to diffuse into the epitaxial layer. Thus, it is necessary to select temperature(s) and time(s) which do not cause these problems. Specifically, about 600° C. to 1,100° C. is preferable. On the other hand, there are substrates that can not be subjected to thermal treatment at high temperature. For example, in the case of the support substrate 110 being made of quartz glass, it can be subjected to the thermal treatment only at a temperature no greater than 200° C. due to differences in the thermal expansion coefficients between silicon and quartz. If this temperature is exceeded, the bonded substrates may be separated or ruptured due to stress. The thermal treatment is sufficient as long as it can endure the stress upon grinding or etching of the bulk silicon 100 performed in the next process. Accordingly, even at a temperature no greater than 200° C., the process can be performed by optimizing the surface processing condition for activation.

Figure 4E:
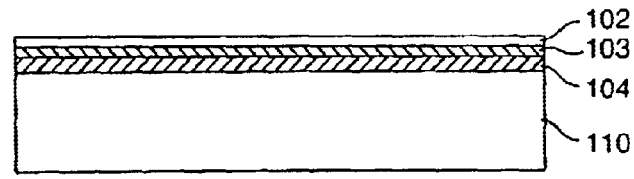
Figure 5A:
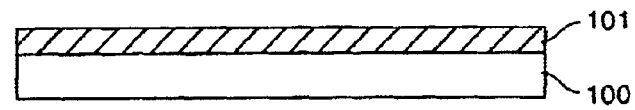
FIGS. 5A to 5G are schematic diagrams for explaining a semiconductor substrate producing process according to an embodiment of the present invention.
Figure 5B:
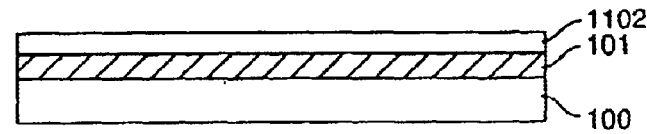
Figure 5C:
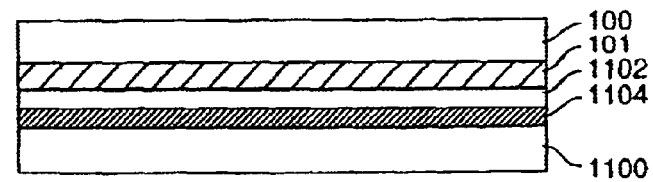
Figure 5D:
Figure 5E:
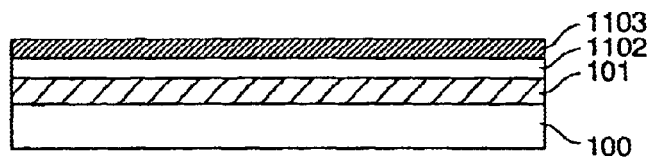
Figure 5F:
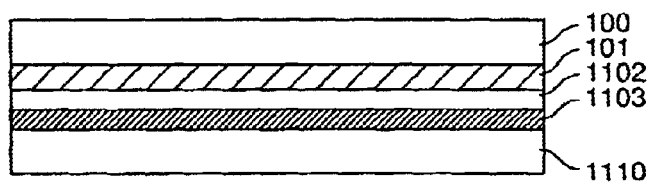
Figure 5G:
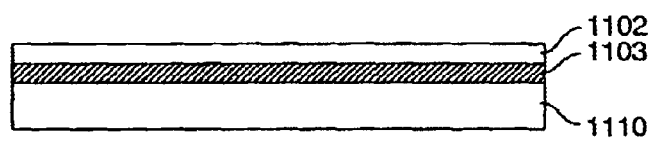
Figure 6A:
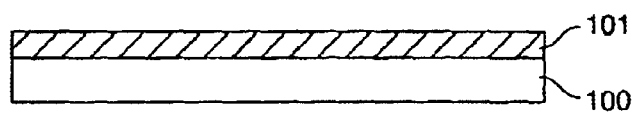
FIGS. 6A and 6B are schematic diagrams for explaining a semiconductor substrate producing process according to an embodiment of the present invention.
Figure 6B:
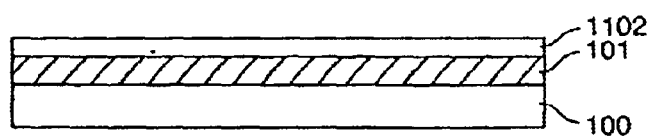
Figure 6C:
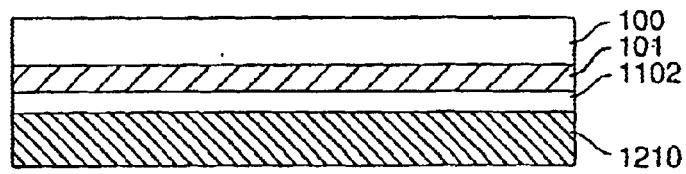
Figure 6D:
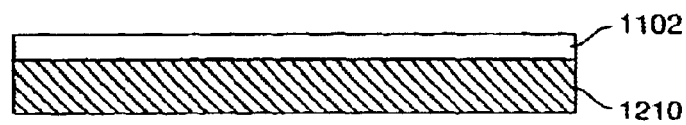
Figure 6E:
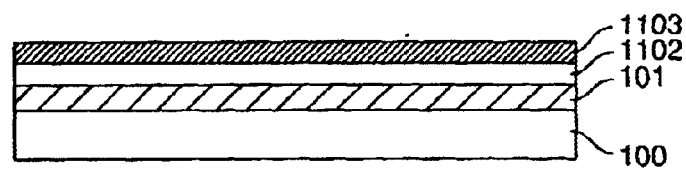
Figure 6F:
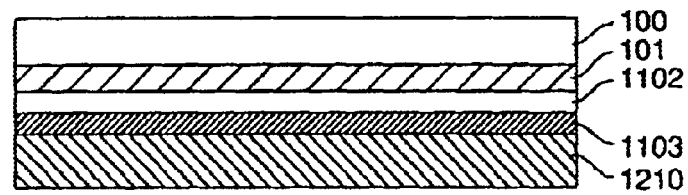
Figure 6G:

Then, by the foregoing method, the substrates are separated into two at the porous silicon layer having the large porosity. The layer having the large porosity can be formed by altering current in the anodization, besides the ion implantation. Subsequently, the silicon substrate portion 100 and the porous portion 101 are selectively removed with the epitaxial layer 102 remaining (FIG. 4E). In this fashion, the SOI substrate is obtained.

(1) The thickness of the wall between the adjacent holes in the oxidized (preoxidation) porous silicon layer, i.e., the pore internal wall of the porous layer, is very small, that is, several nanometers to several tens of nanometers. Thus, if the high-temperature process is applied to the porous layer upon formation of the epitaxial silicon layer or upon heat treatment after bonding, the pore wall may agglomerate and enlarge so that the pore wall may clog the pore and lower the etching speed. In view of this, after formation of the porous layer, a thin oxidized film is formed on the pore wall so as to suppress the enlargement of the pore wall. On the other hand, since it is necessary to epitaxially-grow the non-porous single-crystal silicon layer on the porous layer, it is necessary to oxidize only the surface of the pore inner wall such that the monocrystalline property remains inside the pore wall of the porous layer. It is preferable that the oxidized film is in the range of several angstroms to several tens of angstroms. The oxidized film of such a thickness is formed through heat treatment in an oxygen atmosphere at the temperature of 200° C. to 700° C., and more preferably 250° C. to 500° C.

(2) Thermal Treatment and Etching

In a specific embodiment, the present invention includes a method of applying a thermal treatment and etching to the surface or surfaces of the substrate for smoothing purposes. Here, small roughness on the silicon surface can be removed to obtain very smooth silicon surface. The combination of at least thermal treatment and etching can be performed, for example, after formation of the porous silicon layer and before formation of the epitaxial silicon layer. Apart from this, the thermal treatment and etching can be performed to the SOI substrate obtained after etching removal of the porous silicon layer. Through the thermal treatment and etching process performed before formation of the epitaxial silicon layer, a phenomenon that the pore surface is closed due to migration of silicon atoms forming the porous silicon surface. When the epitaxial silicon layer is formed in the state where the pore surface is closed, the epitaxial silicon layer with fewer crystal defects can be achieved. On the other hand, through the thermal treatment and etching process performed after etching of the porous silicon layer, the epitaxial silicon surface which was more or less roughened by etching can be smoothed out, and boron from the clean room inevitably taken into the bonded interface upon bonding and boron thermally diffused in the epitaxial silicon layer from the porous silicon layer can be removed.

As previously noted, to smooth or treat the surface, the substrate is subjected to thermal treatment in a hydrogen bearing environment. Additionally, the substrate is also subjected to an etchant including a halogen bearing compound such as HCl, HBr, HI, HF, and others. The etchant can also be a fluorine bearing compound such as SF6, OxFx. In preferred embodiments, the present substrate undergoes treatment using a combination of etchant and thermal treatment in a hydrogen bearing environment. In a specific embodiment, the etchant is HCl gas or the like. The thermal treatment uses a hydrogen etchant gas. In some embodiments, the etchant gas is a halogenated gas, e.g., HCl, HF, HI, HBr, SF6, CF4, NF3, and CCl2F2. The etchant gas can also be mixed with another halogen gas, e.g., chlorine, fluorine. The thermal treatment can be from a furnace, but is preferably from a rapid thermal processing tool such as an RTP tool. Alternatively, the tool can be from an epitaxial chamber, which has lamps for rapidly heating a substrate. In an embodiment using a silicon wafer and hydrogen gas, the tool can heat the substrate at a rate of about 10 Degrees Celsius/second and greater or 20 Degrees Celsius/second and greater, depending upon the embodiment.

In one embodiment, it is believed that the hydrogen particles in the detached surface improve the surface smoothing process. Here, the hydrogen particles have been maintained at a temperature where they have not diffused out of the substrate. In a specific embodiment, the concentration of hydrogen particles ranges from about 1021 to about 5×1022 atoms/cm3. Alternatively, the concentration of hydrogen particles is at least about 6×1021 atoms/cm3. Depending upon the embodiment, the particular concentration of the hydrogen particles can be adjusted.

Still further in other embodiments, the present substrate undergoes a process of hydrogen treatment or implantation before thermal treatment purposes. Here, the substrate, including the detached film, is subjected to hydrogen bearing particles by way of implantation, diffusion, or any combination thereof. In some embodiments, where hydrogen has diffused out from the initial implant, a subsequent hydrogen treatment process can occur to increase a concentration of hydrogen in the detached film. The present hydrogen treatment process can occur for substrates made by way of other processes such as those noted below.

Moreover, the present technique for finishing the cleaved surface can use a combination of etchant, deposition, and thermal treatment to smooth the cleaved film. Here, the cleaved film is subjected to hydrogen bearing compounds such as HCl, HBr, HI, HF, and others. Additionally, the cleaved film is subjected to for example, deposition, during a time that the film is subjected to the hydrogen bearing compounds, which etch portions of the cleaved film. Using a silicon cleaved film for example, the deposition may occur by way of a silicon bearing compound such as silanes, e.g., $Si_xCl_yH_z$, $SiH_4$, $SiCl_x$, and other silicon compounds. Accordingly, the present method subjects the cleaved film to a combination of etching and deposition using a hydrogen bearing compound and a silicon bearing compound. Additionally, the cleaved surface undergoes thermal treatment while being subjected to the combination of etchant and deposition gases The thermal treatment can be from a furnace, but is preferably from a rapid thermal processing tool such as an RTP tool. Alternatively, the tool can be from an epitaxial chamber, which has lamps for rapidly heating a substrate. In an embodiment using a silicon wafer and hydrogen gas, the tool can heat the substrate at a rate of about 10 Degrees Celsius/second and greater or 20 Degrees Celsius/second and greater, depending upon the embodiment.

An alternative embodiment will be described with reference to FIGS. 5A to 5G. Numerals in FIGS. 5A to 5G which are the same as those in FIGS. 4A to 4E represent the same portions in FIGS. 4A to 4E. In the embodiment shown in FIGS. 4A to 4E, the surfaces of the two substrates to be bonded are the $SiO_2$ layer 103 and the $SiO_2$ layer 104. However, both of these surfaces are not necessarily the $SiO_2$ layers, but at least one of them may be made of $SiO_2$. In this preferred embodiment, the surface of an epitaxial silicon layer 1102 formed on a porous silicon layer is bonded to the surface of an oxidized film 1104 formed on a silicon substrate 1110, and the surface of an oxidized film 1103 formed by thermal oxidation of the surface of the epitaxial silicon layer 1102 is bonded to the surface of the silicon substrate 1110 which is not oxidized. In this preferred embodiment, the other processes can be performed as in the embodiment shown in FIGS. 4A to 4E.

An alternative embodiment will be described with reference to FIGS. 6A to 6G. Numerals in FIGS. 6A to 6G which are the same as those in FIGS. 4A to 4E represent the same portions in FIGS. 4A to 4E. In this preferred embodiment, a substrate bonded to a substrate formed with an epitaxial silicon film is made of a glass material 1210, such as quartz glass or blue glass. In this preferred embodiment, an epitaxial silicon layer 1102 is bonded to the glass substrate 1210, and an oxidized film 1103 formed by thermal oxidation of the surface of the epitaxial silicon layer 1102 is bonded to the glass substrate 1210. In this preferred embodiment, the other processes can be performed as in the embodiment shown in FIGS. 4A to 4E.

Depending upon the embodiment, the present combination of thermal treatment and etching can be used to remove surface roughness of any of the detached films. The present invention can also use a combination of deposition, etching, and thermal treatment for other films in a porous film process. Further details of producing porous silicon materials are described in U.S. Pat. No. 5,854,123, assigned to Canon Kabushiki Kaisha.

In a specific embodiment, the silicon-on-insulator substrate undergoes a series of process steps for formation of integrated circuits thereon. These processing steps are described in S. Wolf, Silicon Processing for the VLSI Era (Volume 2), Lattice Press (1990), which is hereby incorporated by reference for all purposes.

Although the above description is in terms of a silicon wafer, other substrates may also be used. For example, the substrate can be almost any monocrystalline, polycrystalline, or even amorphous type substrate. Additionally, the substrate can be made of III/V materials such as gallium arsenide, gallium nitride (GaN), and others. The multi-layered substrate can also be used according to the present invention. The multi-layered substrate includes a silicon-on-insulator substrate, a variety of sandwiched layers on a semiconductor substrate, and numerous other types of substrates. Additionally, the embodiments above were generally in terms of providing a pulse of energy to initiate a controlled cleaving action. The pulse can be replaced by energy that is scanned across a selected region of the substrate to initiate the controlled cleaving action. Energy can also be scanned across selected regions of the substrate to sustain or maintain the controlled cleaving action. One of ordinary skill in the art would easily recognize a variety of alternatives, modifications, and variations, which can be used according to the present invention.

While the above is' a full description of the specific embodiments, various modifications, alternative constructions and equivalents may be used. Therefore, the above description and illustrations should not be taken as limiting the scope of the present invention which is defined by the appended claims.

Although the above has been generally described in terms of a PIII system, the present invention can also be applied to a variety of other plasma systems. For example, the present invention can be applied to a plasma source ion implantation system. Alternatively, the present invention can be applied to almost any plasma system where ion bombardment of an exposed region of a pedestal occurs. Accordingly, the above description is merely an example and should not limit the scope of the claims herein. One of ordinary skill in the art would recognize other variations, alternatives, and modifications.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A semiconductor substrate producing method comprising:
    forming a first porous silicon layer on at least one surface of a silicon substrate;
    forming a non-porous layer over said first porous layer;
    forming a second porous layer having a larger porosity than the first porous silicon layer at a constant depth from a surface of said first porous silicon layer, said second porous layer forming step comprising implanting ions into said first porous silicon layer with a given projection range;
    bonding said non-porous layer and a support substrate together, the support substrate being different than the silicon substrate;
    separating said silicon substrate into two portions at said second porous layer;
    removing at least said first porous layer provided over said support substrate to expose said non-porous layer; and
    smoothing said exposed non-porous layer by subjecting a surface of said non-porous layer using an etchant species during a thermal treatment.

2. The semiconductor substrate producing method according to claim 1, wherein said non-porous layer is formed on a surface of said first porous layer before said ion implanting step.

3. The semiconductor substrate producing method according to claim 1 wherein said ions comprise hydrogen.

4. The semiconductor substrate producing method according to claim 1 wherein said ions comprise at least one kind of noble gas, hydrogen and nitrogen.

5. The semiconductor substrate producing method according to claim 1 wherein said separating step is performed by heat-treating said silicon substrate.

6. The semiconductor substrate producing method according to claim 1 wherein said separating step is performed by pressurizing said silicon substrate in a direction perpendicular to a surface thereof.

7. The semiconductor substrate producing method according to claim 1 wherein said separating step is performed by drawing said silicon substrate in a direction perpendicular to a surface thereof.

8. The semiconductor substrate producing method according to claim 1 wherein said separating step is performed by applying a shearing force to said silicon substrate.

9. The semiconductor substrate producing method according to claim 1 wherein said non-porous layer is made of single-crystal Si.

10. The semiconductor substrate producing method according to claim 1 wherein said non-porous layer is made of single-crystal silicon having an oxidized silicon layer on a surface to be bonded.

11. The semiconductor substrate producing method according to claim 1 wherein the etchant comprises HCl.

12. A semiconductor substrate producing method comprising:
    forming on a surface of a silicon substrate a first porous silicon layer, a second porous silicon layer and a third porous silicon layer, wherein the second porous silicon layer is located under the first porous silicon layer and has a porosity higher than the first porous silicon layer, and the third porous silicon layer is located under the second porous silicon layer and has a porosity lower than the second porous silicon layer;
    forming a non-porous monocrystalline semiconductor layer on the first porous silicon layer;
    bonding the non-porous monocrystalline semiconductor layer located on the silicon substrate to another substrate; and
    separating the silicon substrate and the other substrate at the second porous silicon layer so that the non-porous monocrystalline semiconductor layer remains on the other substrate; and
    removing the first porous silicon layer from the non-porous monocrystalline semiconductor layer; and
    subjecting a surface of the non-porous monocrystalline semiconductor layer with thermal energy and an etchant to remove a surface roughness from a first value to a second predetermined value.

13. The semiconductor substrate producing method according to claim 12 wherein said forming step for forming said first, second and third porous silicon layers comprises a step for turning a surface portion of said silicon substrate porous.

14. The semiconductor substrate producing method according to claim 13 wherein said second porous silicon layer is formed by means of ion implantation.

15. The semiconductor substrate producing method according to claim 12 wherein said non-porous monocrystalline semiconductor layer is formed by epitaxial growth.

16. The semiconductor substrate producing method according to claim 12 wherein the etchant comprises HCl.

17. A semiconductor substrate producing method comprising:
    forming on a surface of a silicon substrate a first porous silicon layer;
    implanting ions into the first porous silicon layer to form a second porous silicon layer having a porosity higher than the first porous silicon layer at a constant depth from a surface of the first porous silicon layer;
    forming a non-porous monocrystalline semiconductor layer on the first porous silicon layer;

bonding the non-porous monocrystalline semiconductor layer located on the silicon substrate to another substrate; and separating the silicon substrate and the other substrate at the second porous silicon layer so that the non-porous monocrystalline semiconductor layer remains on the other substrate; and applying a combination of thermal treatment and an etchant to a surface of the non-porous monocrystalline semiconductor layer to reduce a surface roughness to a predetermined value.

18. The method of claim 17 wherein the thermal treatment increases a temperature of the non-porous layer to about at least 1,000 Degrees Celsius.

19. The method of claim 18 wherein the temperature is increased at least about 10 Degrees Celsius per second.

20. The method of claim 18 wherein the temperature is increased at least about 20 Degrees Celsius per second.

21. The method of claim 17 wherein the predetermined value is less than about two nanometers root mean square.

22. The method of claim 17 wherein the etchant comprises a hydrogen bearing compound.

23. The method of claim 17 wherein the etchant comprises a halogen bearing compound selected from at least Cl2, HBr, HI, and HF.

24. The method of claim 17 wherein the etchant comprises HCl.

25. The method of claim 17 wherein the etchant comprises a fluorine bearing compound.

26. The method of claim 25 wherein the fluorine bearing compound is selected from SF6, CF4, NF3, and CCl2F2.

27. A semiconductor substrate producing method comprising:

forming a first porous silicon layer on at least one surface of a silicon substrate;

forming a non-porous layer on said first porous layer;

forming a second porous layer having a larger porosity than the first porous silicon layer within said first porous silicon layer by implanting ions into said first porous silicon layer;

bonding said non-porous layer and a support substrate together, the support substrate being different than the silicon substrate;

separating said silicon substrate into two portions at said second porous layer;

removing said first and second porous layers provided over said support substrate to expose said non-porous layer; and smoothing said exposed non-porous layer by heating a surface of said non-porous layer within an atmosphere containing hydrogen and an etchant.

28. A method of producing a semiconductor substrate, comprising:

providing a silicon substrate having a porous silicon layer on a surface of said silicon substrate;

providing a bonding substrate;

bonding said silicon substrate and said bonding substrate together;

separating said silicon substrate into two portions at said porous silicon layer, said bonding substrate separated from said silicon substrate having a first porous material on a surface of said bonding substrate, said silicon substrate separated from said bonding substrate having a second porous material on said surface of said silicon substrate;

removing said porous material from at least one of said substrates to expose a non-porous layer of said at least one of said substrates;

smoothing said exposed non-porous layer by heating a surface of said non-porous layer within an atmosphere containing hydrogen atoms and an etchant.

29. The method of claim 28, wherein said at least one of said substrates is said bonding substrate and said removed porous material is said first porous material.

30. The method of claim 28, wherein said porous silicon layer of said silicon substrate includes first and second porous layers.

31. The method of claim 30, wherein said second porous layer is more porous than said first porous layer, said silicon substrate being separated into two portions at said second porous layer.

32. The method of claim 31, wherein said second porous layer is provided within said first porous layer.

33. The method of claim 28, wherein said at least one of said substrates is said silicon substrate and said removed porous material is said second porous material.

34. The method of claim 28 wherein the etchant comprises HCl.

* * * * *